US011551759B2

(12) United States Patent
Teague et al.

(10) Patent No.: US 11,551,759 B2
(45) Date of Patent: Jan. 10, 2023

(54) VOLTAGE OFFSET FOR COMPUTE-IN-MEMORY ARCHITECTURE

(71) Applicant: QUALCOMM Incorporated, San Diego, CA (US)

(72) Inventors: Edward Harrison Teague, San Diego, CA (US); Zhongze Wang, San Diego, CA (US); Max Welling, Bussum (NL)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/864,005

(22) Filed: Apr. 30, 2020

(65) Prior Publication Data
US 2021/0343343 A1    Nov. 4, 2021

(51) Int. Cl.
| G11C 7/16 | (2006.01) |
| G11C 16/24 | (2006.01) |
| G11C 16/26 | (2006.01) |
| G11C 16/10 | (2006.01) |
| G11C 7/10 | (2006.01) |
| G11C 16/08 | (2006.01) |

(52) U.S. Cl.
CPC ............ *G11C 16/10* (2013.01); *G11C 7/1069* (2013.01); *G11C 7/16* (2013.01); *G11C 16/08* (2013.01); *G11C 16/24* (2013.01); *G11C 16/26* (2013.01)

(58) Field of Classification Search
CPC ........... G11C 16/10; G11C 7/16; G11C 16/08; G11C 16/24; G11C 7/1069; G11C 16/26
See application file for complete search history.

(56) References Cited

U.S. PATENT DOCUMENTS

| 6,433,822 B1* | 8/2002 | Clark | H04N 5/361 |
| | | | 348/E3.018 |
| 10,964,356 B2* | 3/2021 | Wang | G11C 11/419 |
| 2014/0008515 A1* | 1/2014 | Wang | H03M 1/145 |
| | | | 341/161 |
| 2019/0042199 A1* | 2/2019 | Sumbul | G11C 8/08 |
| 2019/0042949 A1* | 2/2019 | Young | G06F 30/367 |
| 2019/0102359 A1* | 4/2019 | Knag | G06G 7/22 |
| 2019/0370640 A1* | 12/2019 | Peng | G11C 11/419 |

FOREIGN PATENT DOCUMENTS

WO    WO-2020139895 A1 *    7/2020    ............. G06F 7/501

OTHER PUBLICATIONS

Yu et al., A 16K Current-Based 8T Compute-In-Memory Macro with Decoupled Read/Write and 1-5bit col. ADC, Mar. 20, 2020 (Year: 2020).*

(Continued)

*Primary Examiner* — Sung Il Cho
(74) *Attorney, Agent, or Firm* — Edward J. Meisarosh

(57) ABSTRACT

In one embodiment, an electronic device includes a compute-in-memory (CIM) array that includes a plurality of columns. Each column includes a plurality of CIM cells connected to a corresponding read bitline, a plurality of offset cells configured to provide a programmable offset value for the column, and an analog-to-digital converter (ADC) having the corresponding bitline as a first input and configured to receive the programmable offset value. Each CIM cell is configured to store a corresponding weight.

15 Claims, 9 Drawing Sheets

(56) References Cited

OTHER PUBLICATIONS

Huang S., et al., "New Security Challenges on Machine Learning Inference Engine: Chip Cloning and Model Reverse Engineering", ARXIV.ORG, Cornell University Library, 201 OLIN Library Cornell University Ithaca, NY 14853, Mar. 21, 2020 (Mar. 21, 2020), XP081626909, 9 pages, Section IV; figures 1,2,5,6.
International Search Report and Written Opinion—PCT/US2021/030285—ISA/EPO—dated Jul. 16, 2021
Yu C., et al., "A 16K Current-Based 8T Sram Compute-In-Memory Macro with Decoupled Read/Write and 1-5bit col. ADC", 2020 IEEE Custom Integrated Circuits Conference (CICC), IEEE, Mar. 22, 2020 (Mar. 22, 2020), 4 pages, XP033762091, DOI: 10.1109/CICC48029.2020.9075883, [retrieved on Apr. 21, 2020] Abstract; Section II; figures 1-3, 5-7.
Zhang J., et al., "A Machine-Learning Classifier Implemented in a Standard 6T Sram Array", 2016 IEEE Symposium on VLSI Circuits (VLSI-Circuits), IEEE, Jun. 15, 2016 (Jun. 15, 2016), 2 pages, XP032969334, DOI: 10.1109/VLSIC.2016.7573556 [retrieved on 2016-09-21] Section 'Circuit Design', figures 1-4.
Zhang J., et al., "An In-Memory-Computing DNN Achieving 700 TOPS/Wand 6 TOPS/mm2 in 130-nm Cmos", IEEE Journal on Emerging and Selected Topics in Circuits And Systems, IEEE, Piscataway, NJ, USA, vol. 9, No. 2, Jun. 1, 2019 (Jun. 1, 2019), pp. 358-366, XP011729357, ISSN: 2156-3357, DOI: 10.1109/JETCAS.2019.2912352, [retrieved on Jun. 10, 2019], Section III; figures 1,6,8.

* cited by examiner

VOLTAGE OFFSET FOR COMPUTE-IN-MEMORY ARCHITECTURE

FIELD OF THE DISCLOSURE

This disclosure relates generally to a compute-in-memory (CIM) architecture, and, more particularly, to the inputs for the analog-to-digital converters (ADCs) used therein.

DESCRIPTION OF RELATED ART

Artificial neural network (ANN) applications are increasing in number and use. One particularly common type of ANN is a convolutional neural network (CNN), which is an ANN that includes one or more convolutional layers. A convolutional layer uses one or more kernels (also known as filters), which are arrays of weights, to process one or arrays of an input tensor and generate an output tensor. Running inferences with a CNN generally requires numerous computations to perform the many requisite tensor operations. In other words, using CNNs requires performing a vast number of matrix multiplications involving multiplying arrays of weights by corresponding arrays of inputs (also called activations). The computational and power resources of any device are, however, limited. The resources of some electronic devices, such as, for example, mobile devices and Internet of Things (IoT) devices, are particularly limited in comparison to desktop or server devices. One newly emerging architecture that allows for a significant reduction in power used, albeit at a cost of some reduction in accuracy, is the compute-in-memory (CIM) architecture using modified static random-access memory (SRAM) cells.

An exemplary electronic computing device may contain multiple CIM arrays. A CIM array comprises an array of modified SRAM cells programmable to store weights of a corresponding CNN. While the electronic computing devices comprises various digital-domain-computing components, the CIM array combines digital-domain components, analog-domain components, and converter components to convert between the two. The conversions may introduce noise or other inaccuracies into the computations of the electronic computing device. Accordingly, systems and methods to assist in mitigating deleterious effects of conversions between digital-domain components and analog-domain components would be desirable.

SUMMARY

Certain aspects of the present disclosure are directed to an electronic device comprising a compute-in-memory (CIM) array comprising a plurality of columns. Each column comprises a plurality of CIM cells connected to a read bitline, a plurality of offset cells configured to provide a programmable offset value for the column, and an analog-to-digital converter (ADC) having the read bitline as a first input and configured to receive the programmable offset value. Each CIM cell is configured to store a corresponding weight Certain aspects of the present disclosure are directed to a method for an electronic device wherein the electronic device comprises a compute-in-memory (CIM) array, the CIM array comprises a plurality of columns, and each column comprises a plurality of CIM cells connected to a read bitline, a plurality of offset cells, and an analog-to-digital converter (ADC) having the bitline as a first input. The method comprises: storing a corresponding weight in each CIM cell, and providing, to the ADC, by the plurality of offset values, a programmable offset value for the column.

Additional aspects, advantages, and features of the present disclosure may become apparent after review of the entire application.

BRIEF DESCRIPTION OF THE DRAWINGS

The disclosed embodiments will hereinafter be described in conjunction with the appended drawings, provided to illustrate and not to limit the disclosed embodiments, wherein like designations denote like elements, and in which.

DETAILED DESCRIPTION

With reference to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 1:
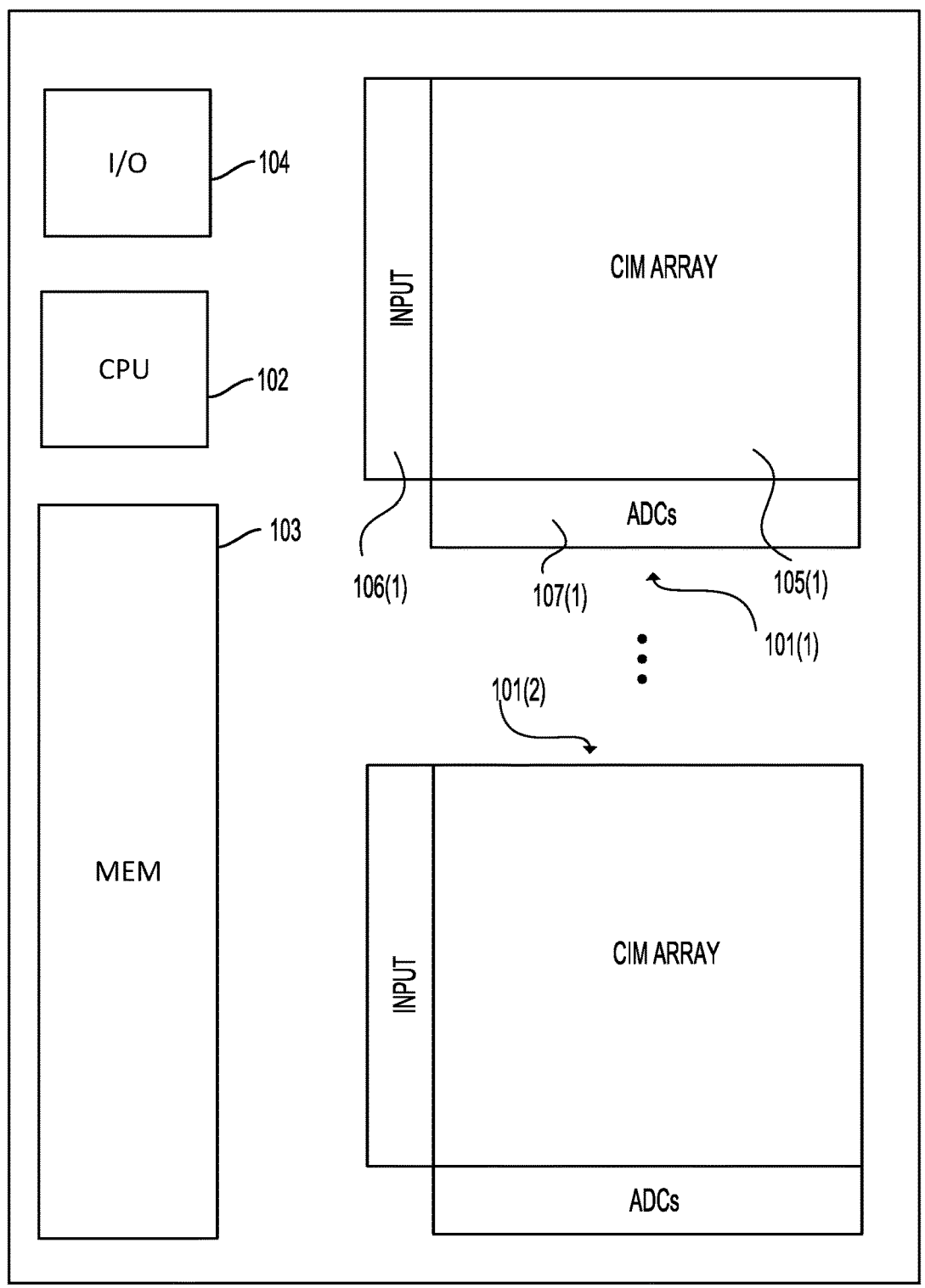
FIG. 1 is a simplified schematic diagram of an exemplary electronic computational device in accordance with some embodiments of the disclosure.

FIG. 1 is a simplified schematic diagram of an exemplary electronic computational device 100 in accordance with some embodiments of the disclosure. Device 100 comprises one or more CIM modules 101, such as exemplary CIM modules 101(1) and 101(2). The device 100 may also comprise a processor 102, a memory module 103, and an I/O module 104. These, and other components (not shown) of the device 100, may be interconnected with a bus, fabric, or other interconnect (not shown). Each CIM module 101 includes a CIM array 105, an input module 106, and an analog-to-digital converter (ADC) module 107, such as the illustrated exemplary CIM module 105(1), input module 106(1), and ADC module 107(1).

The input module 106 routes input from digital components of the device 100, such as, for example, the processor 102 or the memory 103, for use by the cells of the CIM array 105. In some embodiments, the input module 106 includes one or more digital-to-analog converters (DACs) to convert digital input signals into analog signals for use by cells of the CIM array 105. The ADC module 107 converts analog outputs of the CIM array 105 into digital outputs for provision to digital components of the device 100, such as the processor 102 or the memory 103. The device 100 may be, for example, in the form of a system on a chip (SoC). The device 100 may include additional components and/or chips (not shown) and itself be a mobile computing device or an IoT device. The CIM array 105 may be used by the device 100 to perform convolution operations such as, for example, those used in neural-network inferencing. It should be noted that, while multiply-and-accumulate (MAC) is typically used to refer to a digital-domain operation, as used herein, it may also refer to a corresponding operation performed in a mixed analog and digital domains devices, such as the CIM modules 101, which will be explained in greater detail below.

Figure 2:
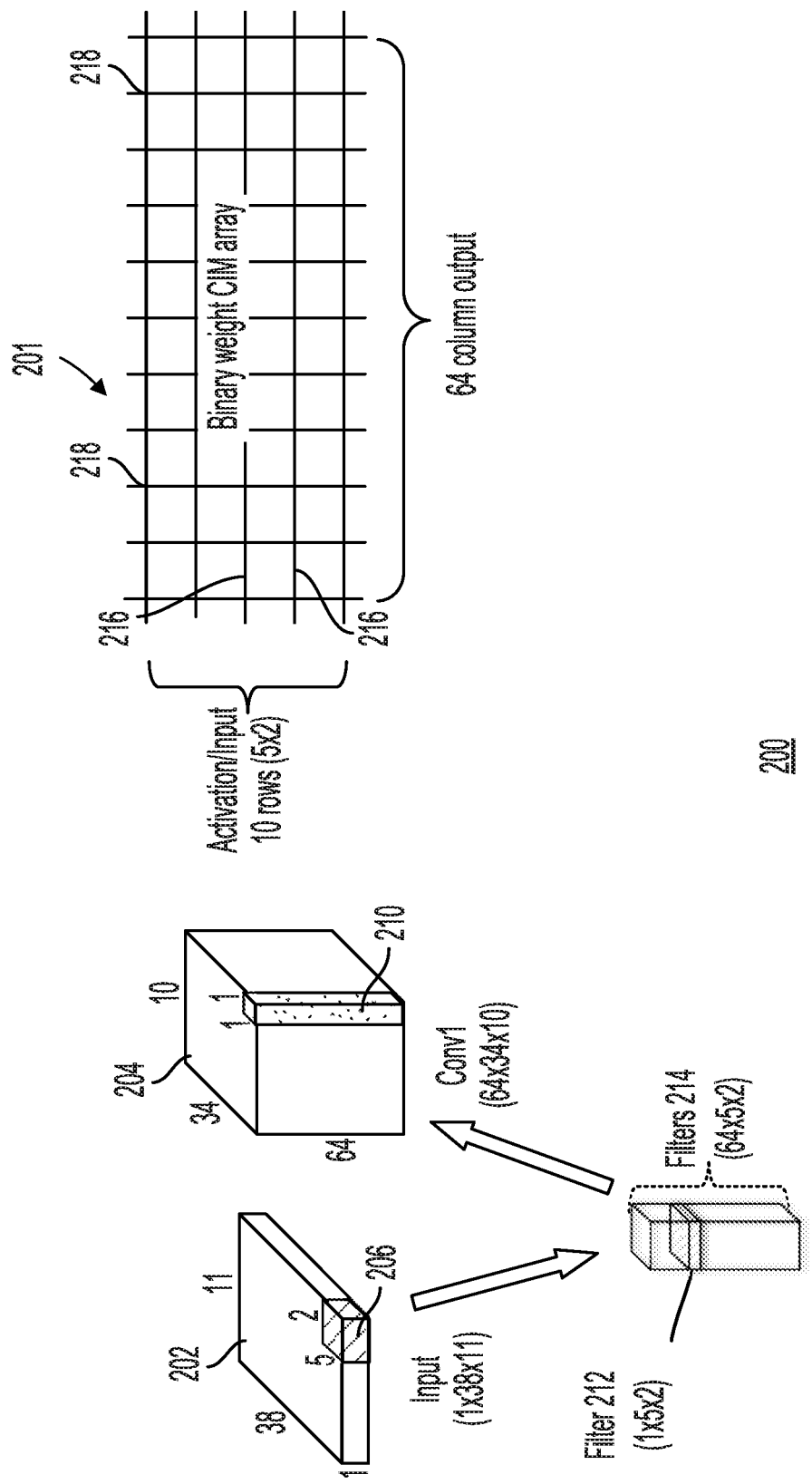
FIG. 2 illustrates an exemplary convolutional layer system using a CIM array such as, for example the CIM array of FIG. 1.

FIG. 2 illustrates an exemplary convolutional layer system 200 using a CIM array 201 such as, for example, CIM array 105(1) of FIG. 1. For example, an input 202 to the convolutional layer system 200 has dimensions of one by thirty-eight by eleven (1 (depth)×38 (height)×11 (width)). An exemplary first layer, illustrated by the convolutional layer architecture 200, has sixty four (64) output channels and, correspondingly, 64 filters, represented by the exemplary 64-filter tensor 214.

Each filter, e.g., exemplary filter 212, of the 64 filters of tensor 214, has dimensions of one by five by two (1×5×2) (together, the filters of tensor 214 make up one 64×5×2 tensor). Each 1×5×2 filter, e.g., filter 212, is convolved with the input 202 to generate one 1×34×10 layer of an output 204 (together, the layers of the output 204 make up a tensor of dimensions 64×34×10). Each 1×34×10 layer of the output 204 represents three thousand four hundred (3400) MAC operations for 340 5×2 receptive fields of the input 202—such as exemplary receptive field 206—and the corresponding filter—such as exemplary filter 212. Note that the layer of system 200 uses a stride of one for the convolution of the input 202; alternative implementations may use different strides resulting in a different number of receptive fields and a differently sized output tensor. Each value of the output tensor 204 represents ten MAC operations for a 5×2 filter and a corresponding 5×2 receptive field.

The six hundred and forty (640) weights of the filter tensor 214 (64×5×2) may be stored in 640 corresponding cells of the CIM array 201, which has at least 10 rows and 64 columns. Note that each cell of the CIM array 201 is both a storage unit and a processing unit. Each column of the CIM array 201 may store the ten values of a corresponding filter 212, essentially transforming the 2-dimensional filter 212 into a one-dimensional vector using any suitable mapping. Note that, for simplicity, the CIM array 201 is illustrated with only a few lines for the input and the output representing, respectively, the rows and columns of the CIM array 201.

Over three hundred and forty (340) operational cycles, the ten (10) values of each of the 340 5×2 receptive fields (e.g., receptive field 206) of the input 202 are input to the CIM array 201 using the wordlines, e.g., 216. Note that each 2-dimensional receptive field is essentially transformed into a one-dimensional vector using the same mapping that is used for the filter. The values of the receptive field are multiplied by the corresponding weights, with the respective products of each of the 64 columns summed to produce a 1×1×64 output tensor (e.g., output tensor 210), which forms a part of the output tensor 204. The output tensor 204 corresponds to an aggreggation of the 340 1×1×64 output tensors for the 340 corresponding receptive fields (e.g., receptive field 206) of the input 202.

The CIM array 201 includes wordlines 216 (e.g., wordlines corresponding to rows of the compute-in-memory array 201) through which the CIM array 201 receives the values of the receptive fields (e.g., receptive field 206) as well as read bitlines 218 (corresponding to columns of the CIM array 201). Note that the CIM array 201 includes additional wordlines and bitlines (not shown in FIG. 2), such as, for example, population count wordlines (PCWL) and read wordlines RWL used in operation of the CIM array 201 and described below. As described above, each intersection of a read bitline 218 and an input wordline 216 represents a CIM cell storing a filter weight value, which is multiplied by an activation value input on the input wordline 216 to generate a product. The individual products along each read bitline 218 are then summed to generate corresponding output values for an output tensor column, such as output tensor 210. The summed value may be in the form of an electric charge, current, or voltage. Note that, although referred to as bitlines, read bitlines of CIM arrays such as CIM array 201 do not function as conventional bitlines of a digital memory array. Rather, they function as conductors in the analog domain for providing an analog input to corresponding ADCs, as described in more detail below.

Figure 3:
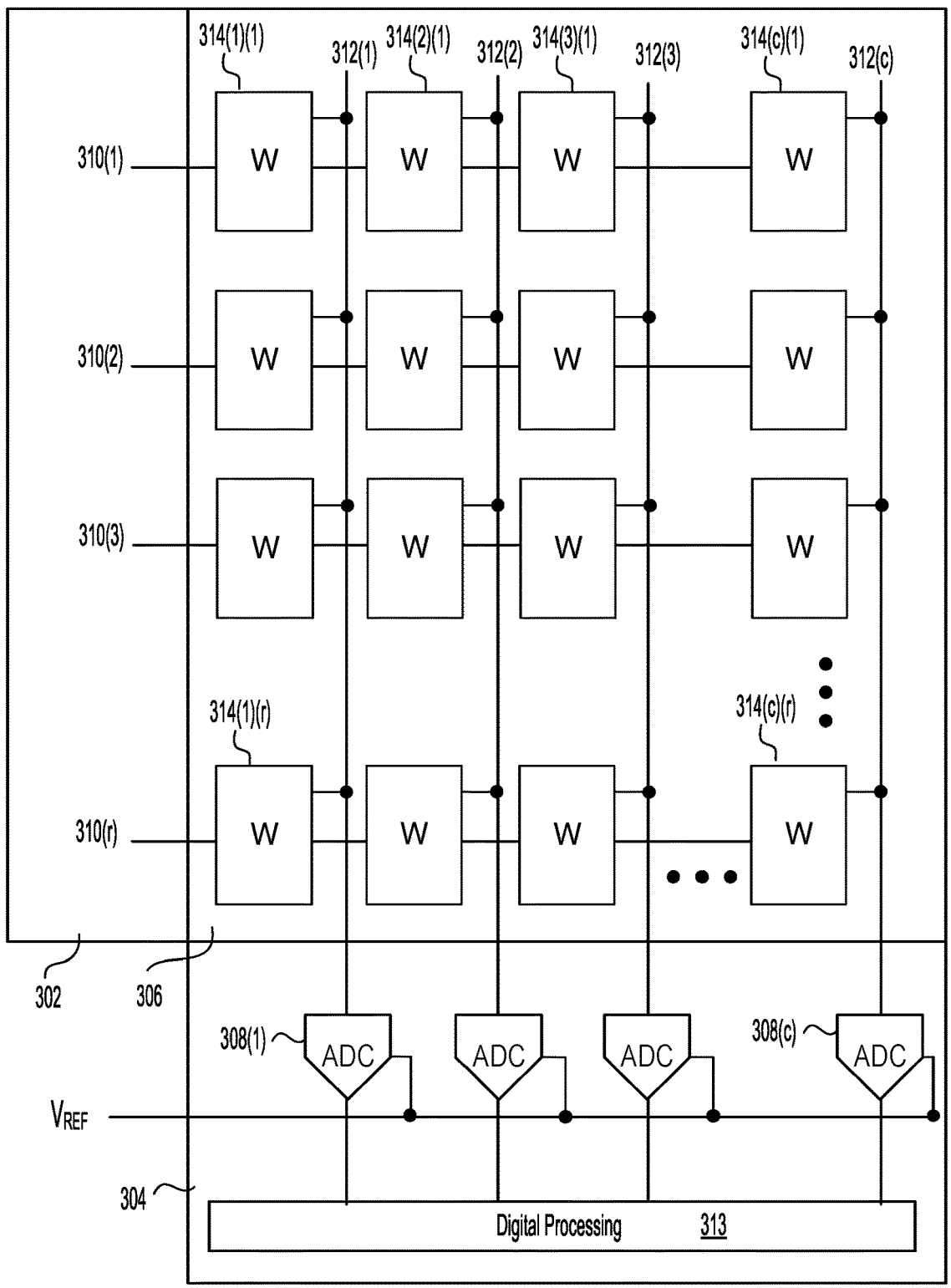
FIG. 3 is a simplified schematic diagram of an exemplary CIM module, which may correspond to, for example, the CIM module of FIG. 1.

FIG. 3 is a simplified schematic diagram of an exemplary CIM module 300, which may correspond to, for example, the CIM module 101 of FIG. 1. The CIM module 300 includes an input module 302, an ADC module 304, and a CIM array 306. The CIM array 306 comprises c columns and r rows of CIM cells 314(1)(1)-314(c)(r), wherein each CIM cell 314(i)(j) is configured to store a corresponding weight value and multiply it with a received input value. The CIM array 306 may correspond to, for example, the CIM array 105 of FIG. 1 or the CIM array 201 of FIG. 2. Each input values is received by a row i of of the CIM array 306—and, correspondingly, by the c CIM cells 314(1)(i)-314(c)(i) of row i—from the input module 302 via a corresponding input line 310(i).

The results of the multiplications by the CIM cells 314(j)(1)-314(j)(r) of each column j are output to a corresponding read bitline 312(j), such as, for example, read bitline 312(1) for column 1. The outputs for the CIM cells 314(j)(1)-314(j)(r) of a column j are summed by the corresponding bitline 312(j) and provided as an input to a corresponding ADC 308(j) in the ADC module 304. Each ADC 308 also receives a reference voltage $V_{REF}$ for use in converting the analog value on the bitline 312(j) into a corresponding digital value. An ADC 308 comprises one or more comparators. An ADC 308 may be any suitable type of ADC, such as, for example, a flash ADC. In some implementations, each ADC 308 is simply a comparator that compares the value on the corresponding bitline 312 to $V_{REF}$ and provides a 1-bit corresponding output based on the comparison. The outputs of the ADCs 308 are provided to digital processing module 313 for further processing, where the further processing may include operations for multi-bit implementations of the CIM module 300.

Figure 4:
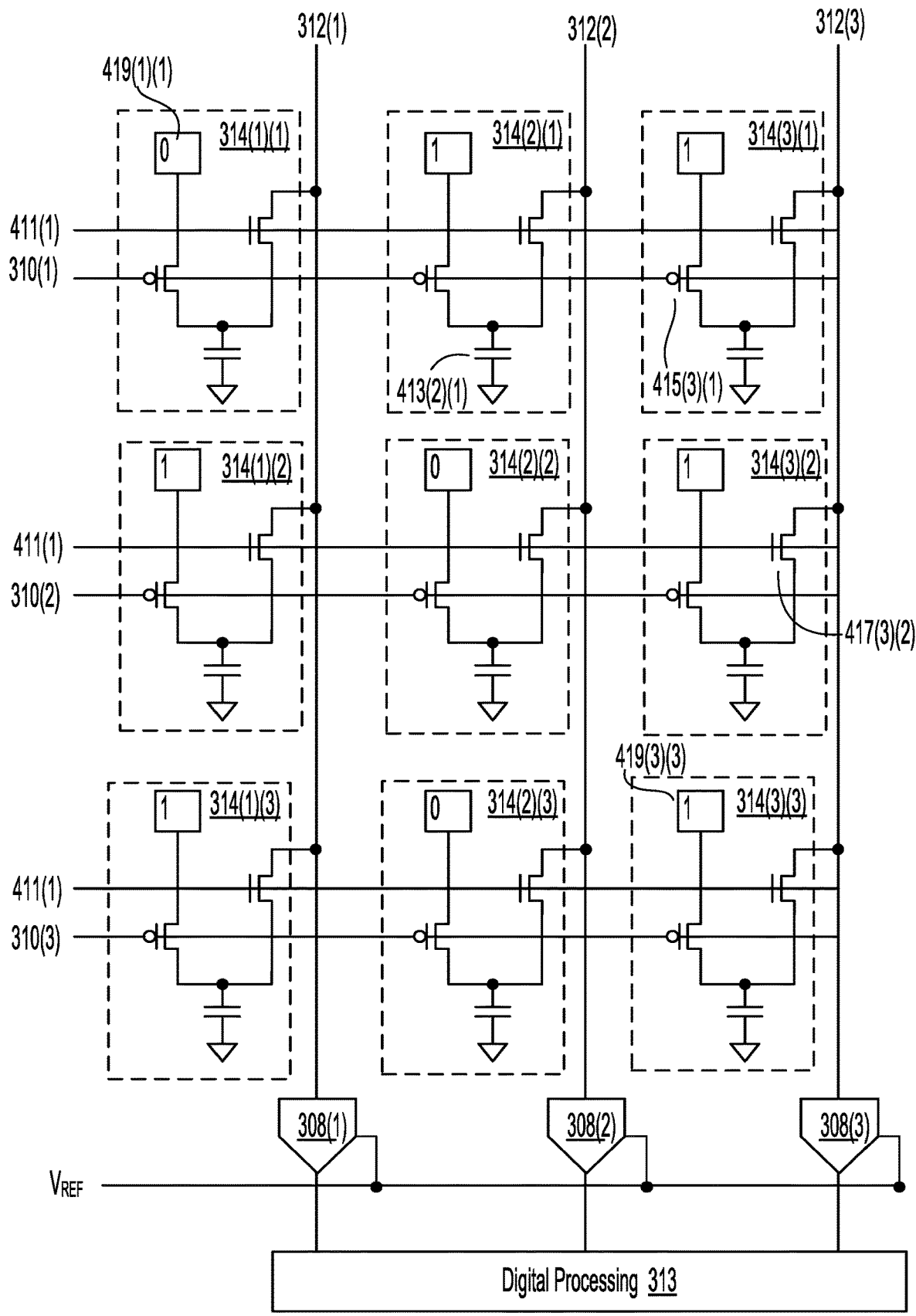
FIG. 4 is a simplified schematic diagram of an exemplary implementation of the CIM module of FIG. 3.

FIG. 4 is a simplified schematic diagram of an exemplary implementation 400 of the CIM module 300 of FIG. 3. The CIM module 400 comprises nine CIM modules 314(1)(1)-314(3)(3) arranged as a 3×3 array. The CIM module 400 also includes input lines 310(1)-310(3), read wordlines (RWLs) 411(1)-411(3), analog-to-digital converters (ADCs) 308(1)-308(3), a digital processing unit 313, and read bitlines 312(1)-312(3). Weight values are stored in SRAM cells 419 of the corresponding CIM modules 314. For improved readability, only SRAM cells 419(1)(1) and 419(3)(3) of corresponding CIM cells 314(1)(1) and 314(3)(3), respectively, are labeled in FIG. 4. Exemplary binary weights are shown in the SRAM cells 419 for illustration. Input activations (e.g., input values that may be an input vector) are provided via the input lines 310. Note that, in some implementations, an input line 310 may be referred to as a population count wordline (PCWL).

Multiplication occurs in each CIM cell 314 and accumulation (summation) by column of the CIM cell 314 multiplication results occurs using the corresponding read bitlines 312. The multiplication in each CIM cell 314 may be in the form of an AND operation of the corresponding activation and weight. In other implementations, other operations may be used to simulate the multiplication phase of a MAC operation. The resultant product is then stored as a charge on a corresponding capacitor 413. Note that, for improved readability, only exemplary capacitor 413(2)(1) of CIM cell 314(2)(1) is labeled in FIG. 4. For example, a product of "1," and, consequently, a corresponding charge on the corresponding capacitor 413, is produced only where the activation is "1" and the weight is "1." Note that in CIM module 300, because the CIM cell 314 uses a PMOS FET 415 (such as exemplary PMOS 415(3)(1) in CIM cell 314(3)(1)) as an input-line transistor, the input line 310 is set to zero to represent an activation of one and vice-versa.

For example, the read bitline 312(1), according to this aspect, accumulates charges of all the CIM cells in column one. For the accumulation phase, the RWLs 411(1)-411(3) are set to high to turn on the NMOS FETs 417 (such as, for example, the labeled exemplary NMOS 417(3)(2) of CIM cell 314(3)(2)), which are used as read-wordline transistors, and pass the charges on the capacitors 413 to the corresponding bitlines 314. The summed charge of the bitline 312(1) is input to ADC 308(1) where, based on the reference voltage $V_{REF}$, the summed charge is converted to a digital output (e.g., a digital signal/number), which may be an input to a next layer of the neural network. If, given the exemplary weight values shown in the SRAM cells 419, the activations on the input lines 310(1)-310(3) were, respectively, for example, 1, 0, 1, then the sums of the bitlines 312(1)-312(3) would be, following the multiplications, respectively, 0+0+1=1, 1+0+0=1, and 1+0+1=2.

Note that, as used herein, input-line transistor refers generally to an active component of the CIM cell—such as, for example, PMOS 415—that is controlled by the input line 310 to selectively connect CIM cell components—such as, for example, the SRAM cell 419 and the capacitor 413. Similarly, read-wordline transistor refers generally to an active component of the CIM cell—such as, for example, NMOS 417—that is controlled by the read wordline to selectively connect CIM cell components —such as, for example, the capacitor 413 and the output to the read bitline 312.

Figure 5:
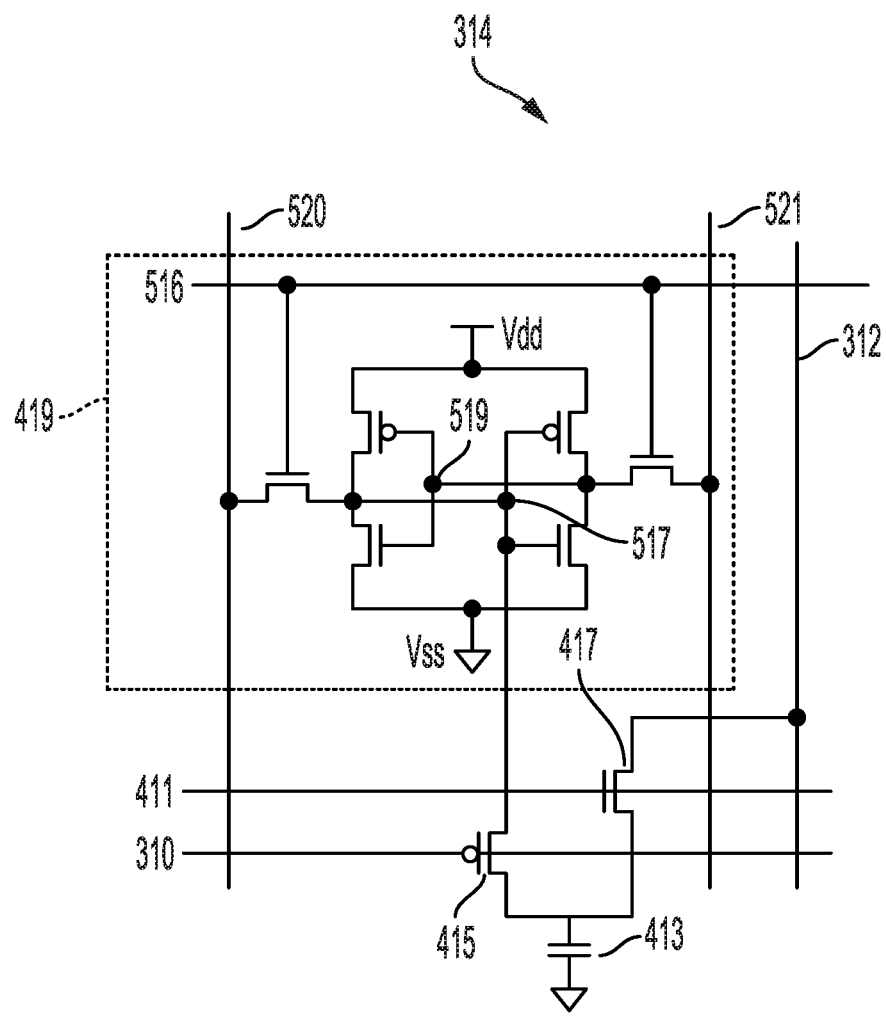
FIG. 5 is a simplified schematic diagram of a CIM cell of FIG. 4, showing additional details, in accordance with some embodiments of the present disclosure.

FIG. 5 is an exemplary simplified schematic diagram of a CIM cell 314 of FIG. 4, showing additional details, in accordance with some exemplary embodiments of the present disclosure. The CIM cell 314 comprises an SRAM cell 419, an input-line transistor 415, a read-wordline transistor 417, and a capacitor 413 coupled to ground. The SRAM cell 419 may be a conventional six transistor (6T) SRAM cell. Note that, although particular types of transistors are shown in FIG. 5, other types of transistors may be substituted with corresponding adjustments of the control signals, as needed. For example, an NMOS transistor can be used in place of the PMOS transistor 415, with an inversion of input signal 310.

Storing of weights in the SRAM cells 419 may be performed once for a multitude of activations, using programming bitlines 520 and 521 and programming wordline 516. For example, in operation, the SRAM cell 419 receives only one bit of information at nodes 517 and 519 via a wordline 516. For example, when the information received at node 517 is a "1" (e.g., high voltage), the other node 519 does not receive information or the information received at node 519 is a "0" (e.g., low voltage). Similarly, when the information received at node 517 is a "0," the information received at node 519 is a "1." The storing of weights may be followed by an an activation input and multiplication step to charge the capacitors 413 in accordance with the corresponding products. The transistor 415 is activated by an activation signal through the input line 310 and the transistor 417 is activated by a signal through the RWL 411. Each RWL 411 is provided to all the CIM cells 314 in a row of a CIM array and the RWL 411 is turned ON to accumulate the values of the column of CIM cells 314 along the corresponding read bitlines 312.

If node 517 is a "0," (e.g., when the the stored weight value is "0"), then the capacitor 413 will not be charged, even if a LOW input line 310 indicates an activation of "1" at the gate of the transistor 415. Accordingly, no corresponding charge will be provided to the corresponding read bitline 312. However, if node 517, which corresponds to the weight value, is a "1," and the input line 310 is set to low (e.g., when the activation value is "1"), which turns on the PMOS transistor 415, then the capacitor 413 will get charged. After the capacitor 413 is charged, the transistor 415 is turned off so the charge remains stored in the capacitor 413. To move the charge from the capacitor 413 to the read bitline 312, the NMOS transistor 417 is turned on by the RWL 411, causing the the NMOS transistor 417 to act as a short between the capacitor 413 and the corresponding read bitline 312. CIM cell 314 may contain additional circuitry such as, for example, reset circuitry (not shown) to reset the charge on the capacitor 413 as needed.

Figure 6:
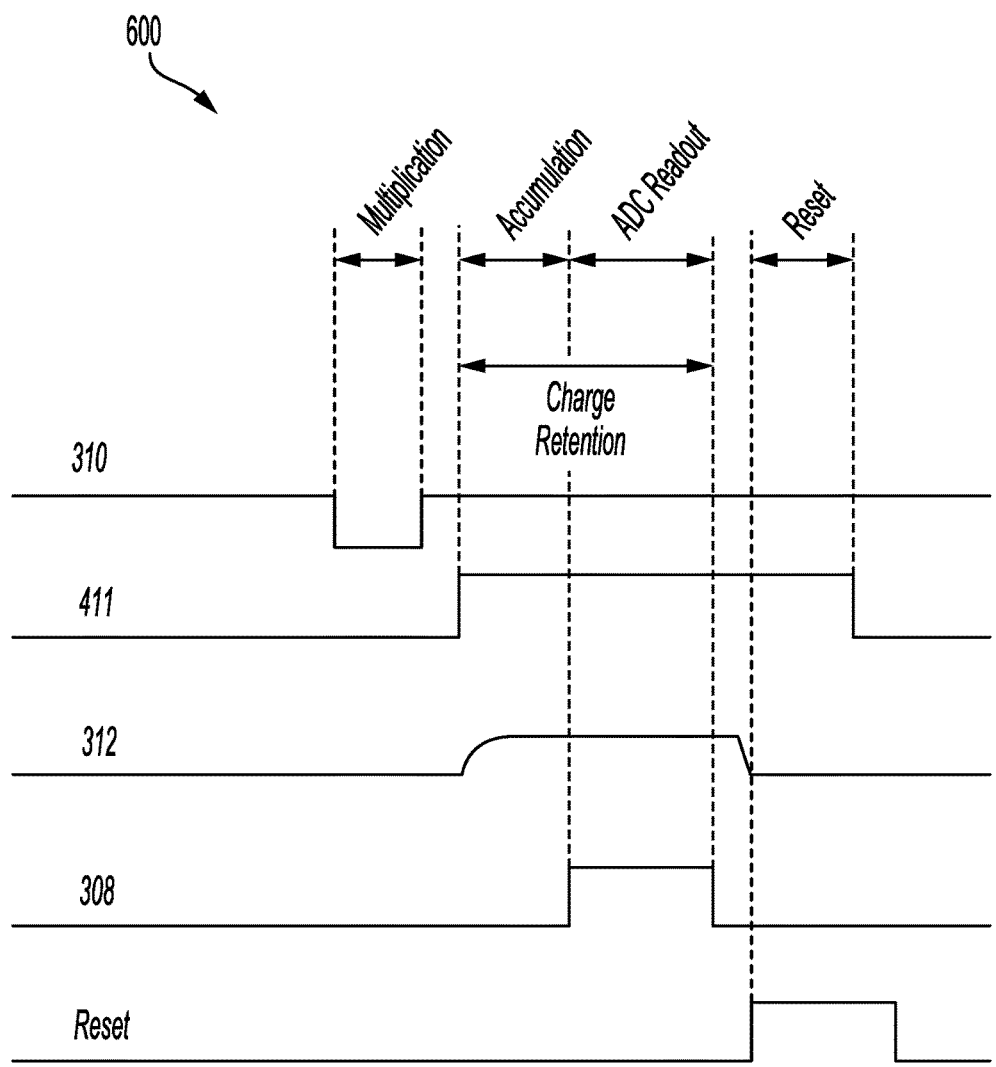
FIG. 6 shows a timing diagram illustrating the timing of various signals during an exemplary operation of the CIM module of FIG. 4 and FIG. 5.

FIG. 6 shows a timing diagram 600 illustrating the timing of various signals during an exemplary operation of the CIM module 314 of FIG. 4 and FIG. 5. First, during a multiplication phase, the input line 310 goes LOW. A LOW input 310 indicates an activation of "1." The PMOS transistor 415 turns on when input 310 is LOW, which allows charging of the capacitor 413 if the weight stored in SRAM cell 419 is a "1." Next, at the start of an accumulation stage, RWL 411 goes high and, then, so does the read bitline (RBL) 312. Then, the readout signal for the ADC 308 goes high for an ADC readout phase. After the ADC 308 readout is obtained, the RBL 312 and the RWL 411 go low, and the reset signal goes high for a reset period, which resets the signals and discharges the capacitor 413 in preparation for processing the next set of activation input.

TABLE 1

| Activation | Input 310 | SRAM cell 419 (Weight) | Capacitor 413 |
|---|---|---|---|
| 1 | 0 | 1 | 1 |
| 1 | 0 | 0 | 0 |
| 0 | 1 | 1 | 0 |
| 0 | 1 | 0 | 0 |

Table 1 illustrates an exemplary operation of the CIM module 314 of FIG. 5. The first column of Table 1 includes possible values of activations. The second column shows corresponding possible input line 310 values. Because transistor 415 is a PMOS transistor, the input line 310 values are inverses of the activation values. The third column lists corresponding possible weights values for the SRAM cell 419. The fourth column shows the resultant products of the activations and weights, which are stored as charge on the corresponding capacitor 413. For example, when the weight at SRAM cell 419 is a "1" (e.g., high voltage) and the input activation is a "1" (so the input 310 is "0"), the capacitor 413 is charged. For all other combinations, the capacitor 413 node will have a value of 0.

Figure 7:
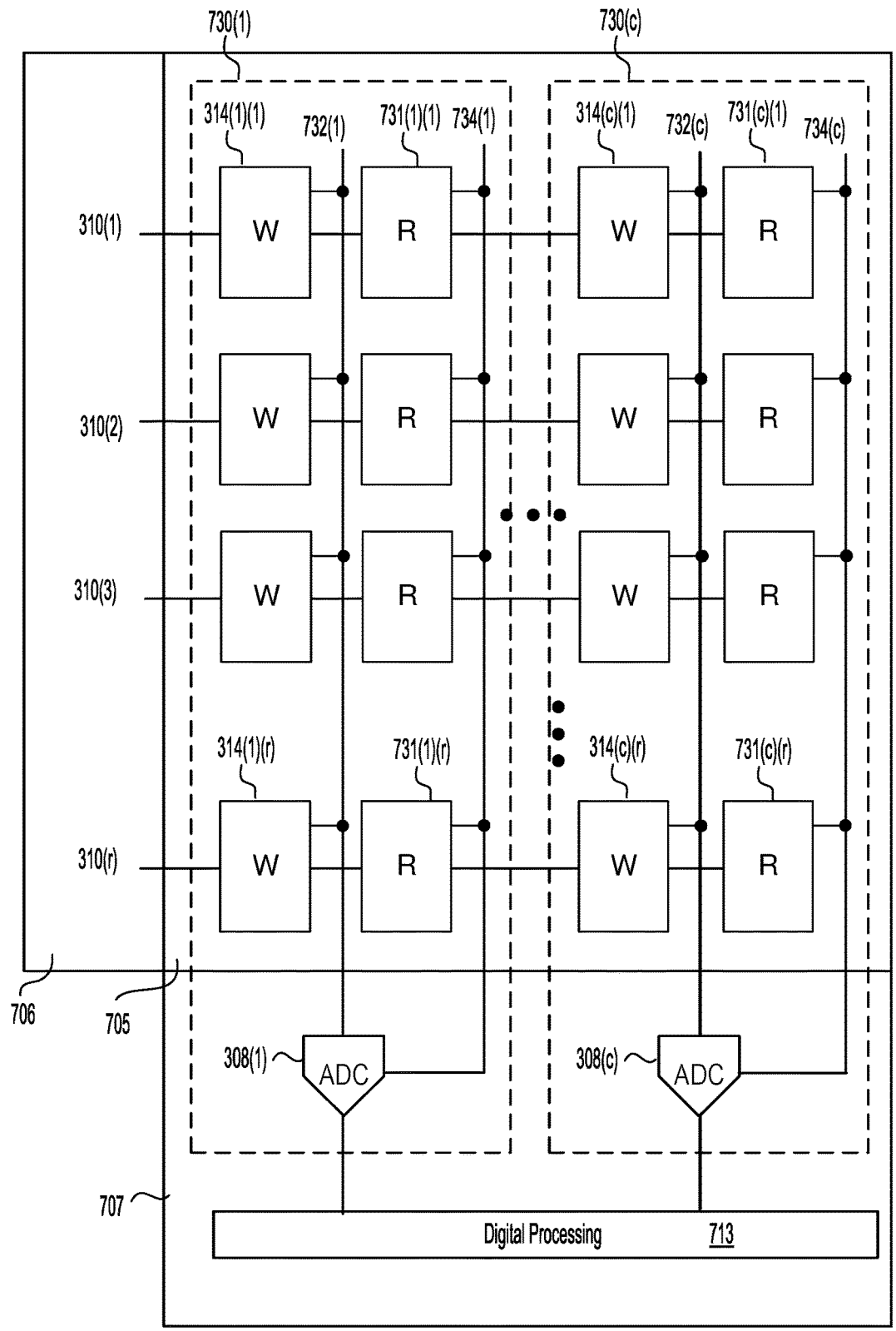
FIG. 7 shows an exemplary CIM module in accordance with some embodiments of the disclosure.

FIG. 7 shows an exemplary CIM module 700 in accordance with some embodiments of the disclosure. The CIM module 700 may correspond to, for example, the CIM module 101 of FIG. 1. The CIM module 700 may comprise many elements that are substantially the same as corresponding elements of the CIM module 300 of FIG. 3. For brevity and clarity, those elements are similarly labeled in FIG. 7 and not described in detail again here. CIM module 700 comprises an input module 706, an ADC module 707, and a CIM array 705. The input module 706 may be substantially similar to the input module 302 of FIG. 3. The CIM module 700 provides for a more-flexible way to provide voltage-reference offset values to the ADCs 308 of the ADC module 707. The ability to flexibly provide voltage-reference offset values may offer several benefits, such as, for example, using the adjustable offset values to implement neural-network bias values, using the offset values to improve quantization implementations, using the offset values to adjust to varying distributions of input values, and, generally, to allow for improved inference accuracy and performance of neural network models using the CIM module 700.

The CIM array 705 comprises a c×r array of CIM cells 314—namely, CIM cells 314(1)(1)-314 (c)(r). Note that, for improved readability, only a few exemplary CIM cells 314 are labeled in FIG. 7. In the CIM array 705, for every column of CIM cells 314 there is a corresponding column of offset cells 731. Specifically, CIM array 705 is organized as c columns 730, where each column 730 comprises a column of CIM cells 314 and a corresponding column of offset cells 731. Every column of CIM cells 314 is connected to a corresponding read bitline 732, which is an input to a corresponding ADC 308. Every column of offset cells 731 is connected to a corresponding offset read bitline 734, which, in turn, is provided to the corresponding ADC 308 as a voltage-reference input. For example, in column 730(1), the r CIM cells 314(1)(1)-314(1)(r) are connected to a corresponding read bitline 732(1), which is an input to the ADC(1), while the r offset cells 731(1)(1)-731(1)(r) are connected to a corresponding offset read bitline 734(1), which is provided as a voltage-reference value to ADC 308(1). This implementation may be referred to as a "dummy columns" implementation.

Offset cells 731 may be modified versions of CIM cells 314. In one implementation, offset cells 731 are identical to CIM cells 314 but disconnected from the input lines 310 and with transistor 415 connected to be always on. In one implementation of offset cells 731, instead of a transistor 415, there is a conductive short connection between the SRAM cell 419 and the capacitor 413. These modifications represent a couple of exemplary ways to prevent the input lines 310 from altering the outputs of the offset cells 731 from their programmed values.

The CIM array 705 may have equal numbers of CIM cells 314 and offset cells 731 symmetrically arranged in each column 730 for greater design, routing, and/or manufacturing convenience. In addition, having an equal number of offset cells 731 allows for relatively large voltage-reference offset values. Note, however, that a symmetric equal-number arrangement is not required, and alternative implementations may have unequal numbers of CIM cells 314 and offset cells 731, asymmetrically arranged, in each column 730.

In operation, the offset cells 731 are programmed together with the CIM cells 314. In other words, the offset values, which may be predetermined for each column 730, are stored in the offset cells 731 at substantially the same time as the weights are stored in the CIM cells 314. After the weights and offsets are loaded into the CIM array 705, operation proceeds substantially as described above in reference to FIG. 3, FIG. 4, FIG. 5, and FIG. 6, but where the voltage reference value used by the ADCs 308 is determined, per ADC 308, by the corresponding offset cells 731. The outputs of the ADCs 308 may then be further processed by digital processing module 713, which may be similar to the above-described digital processing module 313 of FIG. 3.

Figure 8:
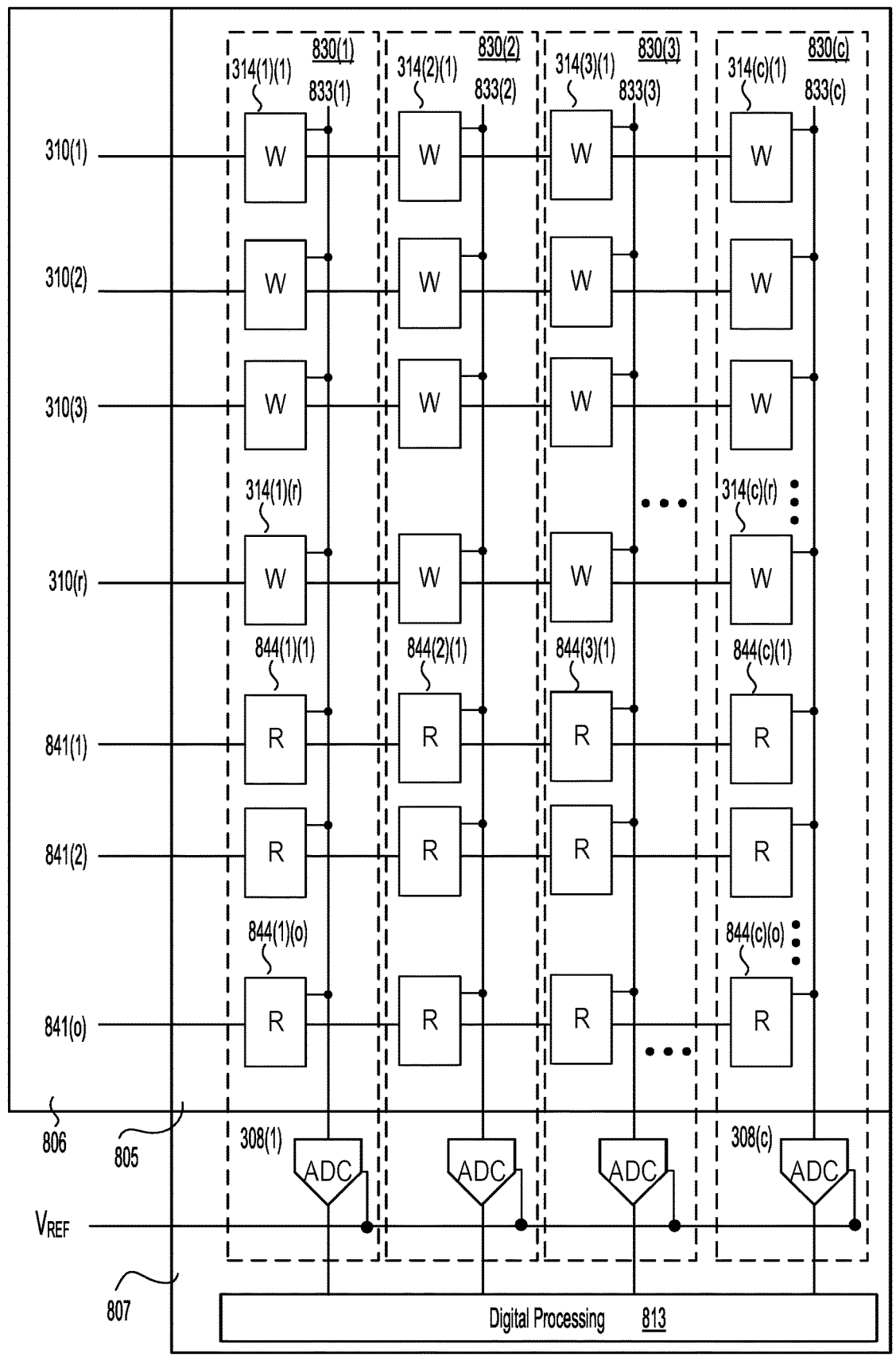
FIG. 8 shows an exemplary CIM module 800 in accordance with some embodiments of the disclosure.

FIG. 8 shows an exemplary CIM module 800 in accordance with some embodiments of the disclosure. The CIM module 800 may correspond to, for example, the CIM module 101 of FIG. 1. The CIM module 800 may comprise many elements that are substantially the same as corresponding elements of the CIM module 300 of FIG. 3. For brevity and clarity, those elements are similarly labeled in FIG. 8 and not described in detail again here. The CIM module 800 comprises an input module 806, an ADC module 807, and a CIM array 805. Similar to the CIM module 700 of FIG. 7, the CIM module 800 provides for a flexible way to provide voltage-reference offset values to the ADCs 308 of the ADC module 807.

The CIM array 805 comprises a c×r array of CIM cells 314, namely, CIM cells 314(1)(1)-314(c)(r), as well as a c×o array of offset cells 844, namely, offset cells 844(1)(1)-844(c)(o). Note that, for improved readability, only a few exemplary CIM cells 314 and offset cells 844 are labeled in FIG. 8. The CIM array 805 is organized as c columns 830, where each column 830 comprises a column of r CIM cells 314 and o offset cells 844. The CIM cells 314 and offset cells 844 of each column 830 are connected to a corresponding read bitline 833, which is provided as an input to the corresponding ADC 308. For example, in column 830(1), the r CIM cells 314(1)(1)-314(1)(r) and the o offset cells 844(1)(1)-844(1)(o) are connected to the corresponding read bitline 833(1), which is provided as an input to ADC 308(1). This implementation, which may be referred to as a "dummy rows" implementation, provides an alternative way to effectively simulate flexibly adjustable reference voltages for the ADCs, using significantly fewer offset cells than the CIM array 705 of FIG. 7.

The offset cells 844 may be identical to, or modified versions of, the CIM cells 314. In one implementation, the offset cells 844 are identical to the CIM cells 314, where the offset input lines 841 for the offset cells 844 activate the corresponding transistors of the offset cells 844 every time new input data is provided to the CIM cells 314 via the input lines 310; in other words, the inputs on lines 841 always correspond to activations of "1."

In one implementation of the CIM module 800, the CIM array 805 comprises a c×(r+o) array of flexible cells whose function as a CIM cell 314 or an offset cell 844 is dynamically determined during operation. In other words, for any set of activations, a first number of rows may be designated as, and be operated to function as, rows of CIM cells 314 and a second number of rows may be designated as, and be operated to function as, rows of offset cells 844. Note that although FIG. 8 shows a particular ordering of rows of CIM cells 314 and rows of offset cells 844, they may instead be in any other suitable order, including interleaved orders.

In one alternative implementation, the transistors 415 of the offset cells 844 are connected to be always on and either the offset cells 844 are disconnected from the offset input lines 841 or the offset input lines 841 are absent. In one implementation of offset cells 844, instead of a transistor 415, there is a conductive short connection between the SRAM cell 419 and the capacitor 413.

The CIM array 805 may have CIM cells 314 and offset cells 844 sharing internal and external design elements within each column 830 for greater design, routing, and/or manufacturing convenience. Typically, each column 830 would have many more rows of CIM cells 314 than offset cells 844, which would be sufficient to provide voltage offset capabilities for most purposes.

In operation, the offset cells 844 are programmed together with the CIM cells 314. In other words, the offset values, which may be predetermined for each column 830, are stored in the offset cells 844 at substantially the same time as the weights are stored in the CIM cells 314. After the weights and offsets are loaded into the CIM array 805, operation proceeds substantially as described above in reference to FIG. 3, FIG. 4, FIG. 5, and FIG. 6, but where the input to each ADC 308 is offset by the values of the corresponding offset cells 844. The outputs of the ADCs 308 may then be further processed by digital processing module 813, which may be similar to the above-described digital processing module 313 of FIG. 3 or module 713 of FIG. 7.

In one alternative implementation, the offset values correspond to the inputs instead of the weights and are dynamically programmed via the offset input lines 841 with each new set of input values provided to the CIM array 805 via the input lines 310. In this implementation, the SRAM cells of the offset cells 844 are preprogrammed to all have "weight" values of "1" so that when when the "weights" of the offset cells are multiplied by the inputs on the offset input lines 841, the offset cells output the corresponding offset input value to the to the corresponding read bitlines 833.

Figure 9:
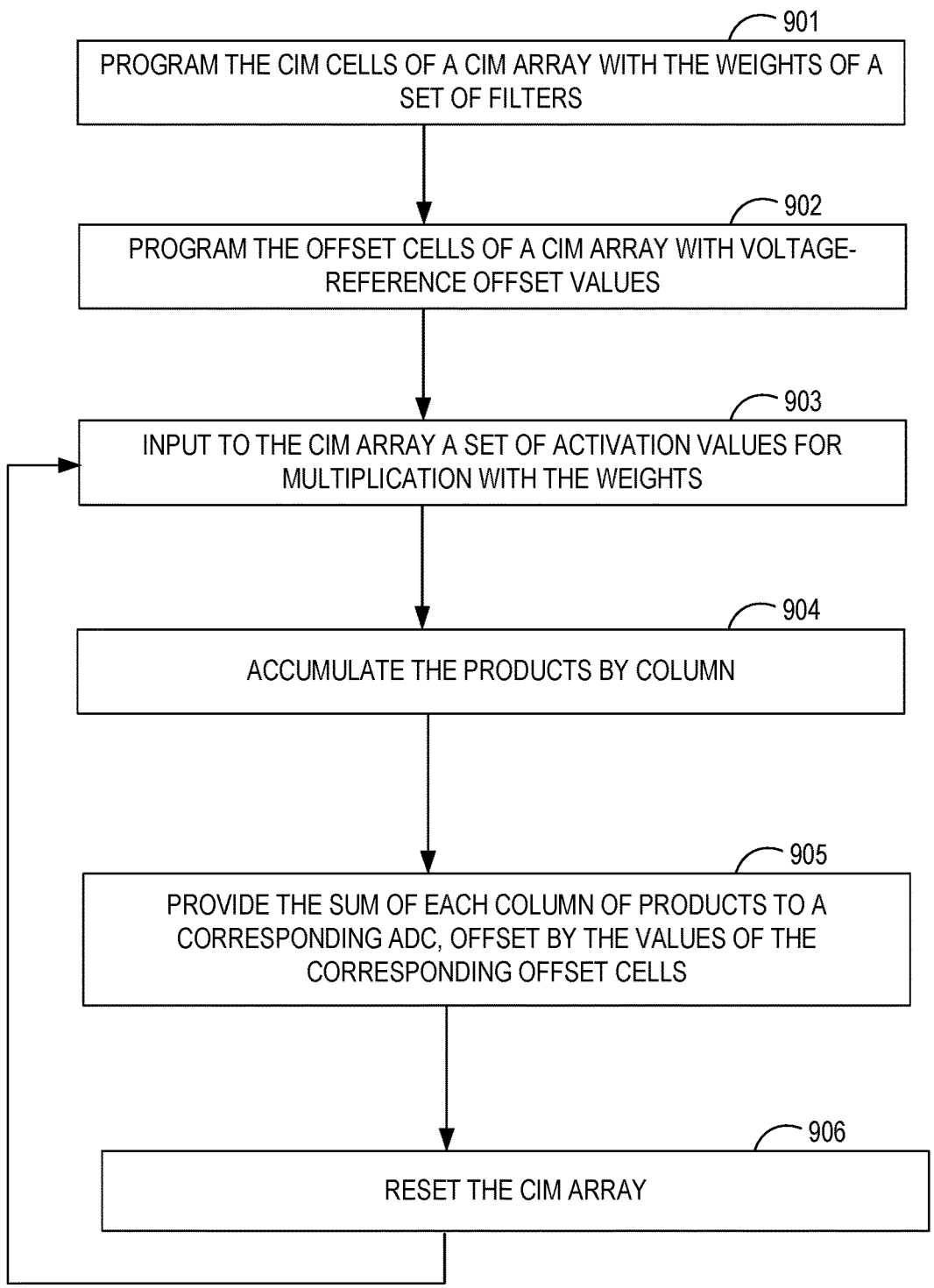
FIG. 9 is a flowchart for an exemplary process in accordance with some embodiments of the disclosure.

FIG. 9 is a flowchart for an exemplary process 900 in accordance with some embodiments of the disclosure. Process 900 starts with programming the CIM cells of a CIM array with the weights of a set of filters (step 901) and programming the offset cells of the CIM array with voltage-reference offset values (step 902). Once the weight and offset values are programmed, a set of activation values is input to the CIM array for multiplication with the weights (step 903). The products of the multiplications are accumulated by column (step 904). The sums are provided to a corresponding ADC, offset by the values of the corresponding offset cells (step 905). The CIM array is then reset (step 906) and the process returns to step 903 to process another set of activation values. Note that, if certain conditions are met—such as, for example, completing the proceesing of a particular input set—then the process 900 may instead go from resetting the CIM array (step 906) to again programming the CIM cells and offset cells (steps 901 and 902).

The above detailed description set forth above in connection with the appended drawings describes examples and does not represent the only examples that may be implemented or that are within the scope of the claims. The terms "example" or "exemplary," when used in this description, means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An electronic device comprising a compute-in-memory (CIM) array comprising a plurality of columns, wherein:
    each column comprises:
        a plurality of CIM cells connected to a read bitline;
        a plurality of offset cells configured to provide a programmable offset value for the column; and
        an analog-to-digital converter (ADC) having the read bitline as a first input and configured to receive the programmable offset value, wherein the ADC is configured to receive, as a second input, the programmable offset value; and
    each CIM cell is configured to store a corresponding weight.

2. The electronic device of claim 1, wherein, for each column:
    the plurality of CIM cells is configured to receive a corresponding plurality of input values;

each CIM cell is configured to generate an output based on both the corresponding stored weight and the corresponding input value and to provide the output to the read bitline;
the read bitline is configured to provide a sum of the outputs of the CIM cells to the ADC; and
the ADC is configured to generate and output a digital value corresponding to the provided sum of CIM cell outputs.

3. The electronic device of claim 2, wherein, for each column:
each offset cell of the plurality of offset cells is configured to store a value and configured to provide its stored value to an offset bitline;
the offset bitline is different from the read bitline;
the offset bitline is not connected to any CIM cell of the plurality of CIM cells;
the offset bitline is configured to sum the values provided by the corresponding offset cells to generate the programmable offset value;
the offset bitline is configured to provide the programmable offset value to the ADC as the second input; and
the ADC is configured to use the programmable offset value to set the reference voltage value for use in generating the digital value corresponding to the provided sum.

4. The electronic device of claim 3, wherein:
each CIM cell comprises a static random-access memory (SRAM) cell connected to a corresponding capacitor via an input-line transistor controlled by the input value;
the capacitor of each CIM cell is connected to the read bitline via a read-wordline transistor controlled by a corresponding read wordline;
each offset cell comprises an SRAM cell connected to the offset bitline via a corresponding read-wordline transistor controlled by a corresponding read wordline.

5. The electronic device of claim 4, wherein, for each column:
each CIM cell has a corresponding offset cell;
the read wordline corresponding to the CIM cell is the same as the read wordline corresponding to the corresponding offset cell.

6. The electronic device of claim 2, wherein, for each column:
each CIM cell is a flexible cell configured to be dynamically programmed to function as a CIM cell; and
each offset cell is a flexible cell configured to be dynamically programmed to function as an offset cell.

7. An electronic device comprising a compute-in-memory (CIM) array comprising a plurality of columns, wherein:
each column comprises:
a plurality of CIM cells connected to a read bitline;
a plurality of offset cells configured to provide a programmable offset value for the column; and
an analog-to-digital converter (ADC) having the read bitline as a first input and configured to receive the programmable offset value, wherein the ADC is configured to receive, as a second input, a reference voltage value;
each CIM cell is configured to store a corresponding weight;
each CIM cell comprises a static random-access memory (SRAM) cell connected to a corresponding capacitor via an input-line transistor controlled by the input value;
the capacitor of each CIM cell is connected to the read bitline via a read-wordline transistor controlled by a corresponding read wordline; and
for each column:
each offset cell of the plurality of offset cells is configured to store a value and configured to provide its stored value to the read bitline;
the programmable offset value is a sum of the stored values of the plurality of offset cells; and
the read bitline is configured to add the programmable offset value to the sum of the outputs of the CIM cells to provide to the ADC as the first input.

8. The electronic device of claim 7, wherein, for each column,
each offset cell comprises an SRAM cell connected to the offset bitline via a corresponding read-wordline transistor controlled by a corresponding read wordline.

9. The electronic device of claim 7, wherein, for each column, each offset cell and each CIM cell consist of the same components.

10. A method for an electronic device wherein:
the electronic device comprises a compute-in-memory (CIM) array;
the CIM array comprises a plurality of columns;
each column comprises:
a plurality of CIM cells connected to a read bitline;
a plurality of offset cells; and
an analog-to-digital converter (ADC) having the read bitline as a first input;
the method comprising:
storing a corresponding weight in each CIM cell;
providing, to the ADC, by the plurality of offset values, a programmable offset value for the column, wherein the ADC is configured to receive, as a second input, the programmable offset value.

11. The method of claim 10, further comprising:
receiving, by the plurality of CIM cells, a corresponding plurality of input values;
generating, by each CIM cell, an output based on both the corresponding stored weight and the corresponding input value;
providing, by each CIM cell, the output to the read bitline;
providing, by the read bitline, a sum of the outputs of the CIM cells to the ADC; and
generating and outputting, by the ADC, a digital value corresponding to the provided sum of CIM cell outputs.

12. The method of claim 11, further comprising:
storing a corresponding value in each offset cell of the plurality of offset cells;
providing, by each offset cell, its stored value to an offset bitline, wherein the offset bitline is different from the read bitline and the offset bitline is not connected to any CIM cell of the plurality of CIM cells;
generating the programmable offset value, by the offset bitline, by summing the values provided by the corresponding offset cells;
providing to the second input of the ADC, by the offset bitline, the programmable offset value; and
generating the digital value corresponding to the provided sum, by the ADC, using the programmable offset value to set the reference voltage value for the generating.

13. The method of claim 12, wherein:
each CIM cell comprises a static random-access memory (SRAM) cell connected to a corresponding capacitor via an input-line transistor controlled by the input value;

the capacitor of each CIM cell is connected to the read bitline via a read-wordline transistor controlled by a corresponding read wordline;

each offset cell comprises an SRAM cell connected to the offset bitline via a corresponding read-wordline transistor controlled by a corresponding read wordline.

14. The method of claim 13, wherein, for each column:

each CIM cell has a corresponding offset cell;

the read wordline corresponding to the CIM cell is the same as the read wordline corresponding to the corresponding offset cell.

15. The method of claim 11, wherein each CIM cell and each offset cell is a flexible cell, the method further comprising:

dynamically programming each of a first of flexible cells to function as a CIM cell; and dynamically programming each of a second set of flexible cells to function as an offset cell.

* * * * *